（12）United States Patent
Sawada

(10) Patent No.: US 7,247,945 B2
(45) Date of Patent: Jul. 24, 2007

(54) SEMICONDUCTOR APPARATUS

(75) Inventor: Yasuhiro Sawada, Chofu (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 11/300,230

(22) Filed: Dec. 13, 2005

(65) Prior Publication Data

US 2006/0125097 A1   Jun. 15, 2006

(30) Foreign Application Priority Data

Dec. 13, 2004   (JP)   .............................. 2004-360498
Dec. 1, 2005    (JP)   .............................. 2005-347938

(51) Int. Cl.
*H01L 23/48*   (2006.01)
*H05K 1/18*    (2006.01)

(52) U.S. Cl. ...................... 257/738; 257/777; 257/778; 257/723; 361/760; 361/761; 361/790

(58) Field of Classification Search ................ 361/760, 361/790, 761; 257/777, 780, 723, 724, 738, 257/685
See application file for complete search history.

(56) References Cited

U.S. PATENT DOCUMENTS 6,678,167 B1 *   1/2004   Degani et al. .............. 361/760
6,747,362 B2 *   6/2004   Barrow ........................ 257/786
7,045,901 B2 *   5/2006   Lin et al. .................... 257/778
2002/0079568 A1 * 6/2002 Degani et al. .............. 257/686

FOREIGN PATENT DOCUMENTS

JP   5-82937     4/1993
JP   9-162241    6/1997
JP   2001-326322 11/2001

* cited by examiner

*Primary Examiner*—Long K. Tran
(74) *Attorney, Agent, or Firm*—Morgan & Finnegan L.L.P.

(57) ABSTRACT

A semiconductor apparatus includes a printed circuit board, a peripheral type first semiconductor package which has a first group of ball electrodes arranged in a peripheral type first arrangement area and a first group of additional ball electrodes arranged inside the first arrangement area and which is arranged on a first surface of the printed circuit board, and a peripheral type second semiconductor package which has a second group of ball electrodes arranged in a second arrangement area and a second group of additional ball electrodes arranged inside the second arrangement area and which is arranged on a second surface of the printed circuit board. A ball electrode located at at least one corner of the first group of ball electrodes is arranged at a position to oppose a corner of the second arrangement area, and at least one ball electrode of the second group of ball electrodes is arranged at a position to oppose the second group of additional ball electrodes through the printed circuit board.

16 Claims, 13 Drawing Sheets

SEMICONDUCTOR APPARATUS

FIELD OF THE INVENTION

The present invention relates to a semiconductor apparatus and a method of manufacturing the same and, more particularly, to a mounted structure for a semiconductor package in which a plurality of ball electrodes are arranged.

BACKGROUND OF THE INVENTION

Conventionally, an electronic device uses a semiconductor apparatus mounted with a semiconductor package in which a plurality of solder ball electrodes are arranged in an array. At this time, a semiconductor device and package mold which form the semiconductor package, a printed circuit board, and the ball electrodes which bond the semiconductor package to the printed circuit board have different coefficients of thermal expansion. Hence, when heat is applied to the semiconductor apparatus, a large stress locally acts on the ball electrodes serving as a bonding portion to considerably shorten the service life of the bonding portion.

As a method of decreasing such a thermal stress, a technique is known in which reinforcing projections (bumps) are arranged in the vicinities of, among the ball electrodes arranged in an array, those at the outermost portion and innermost portion on which the largest stress acts (see Japanese Patent Laid-Open No. 9-162241 (FIGS. 2, 4, and 6 on pages 2 and 3)).

In recent years, as the mounting integration degree increases, semiconductor packages are often respectively mounted on the two surfaces of a printed circuit board. When the semiconductor packages are mounted on the two surfaces of the printed circuit board, one semiconductor package constrains deformation of the other semiconductor package, so that the printed circuit board cannot flex freely. Therefore, a larger stress acts on the solder bonding portion than in a case wherein a semiconductor package is mounted on only one surface of the printed circuit board, thus largely degrading the reliability.

In view of this, for mounting the semiconductor packages on the two surfaces of the printed circuit board, a method of decreasing the thermal stress of the ball electrodes is known. More specifically, this method comprises a technique of arranging the semiconductor packages respectively on the two surfaces of the printed circuit board such that the ball electrode portions of the semiconductor packages do not correspond to the same positions on the two surfaces of the printed circuit board (see Japanese Patent Laid-Open No. 5-82937 (FIGS. 1 to 3 on pages 3 and 4)).

Similarly, a method is also known of decreasing the warp of a printed circuit board having two surfaces where semiconductor package mold printed circuit boards are respectively mounted. More specifically, this method comprises a technique of respectively arranging plates each having openings on the two surfaces of a printed circuit board such that opposing frames overlap at least partially (see Japanese Patent Laid-Open No. 2001-326322 (FIGS. 1 and 2 on pages 5 and 6)).

According to the mounting method described in Japanese Patent Laid-Open No. 5-82937, the semiconductor devices are bonded at the lead portions such that the semiconductor packages to be mounted on the two surfaces of the circuit board are shifted from each other between the upper and lower surfaces. If, however, semiconductor packages each having ball electrodes arranged in an array are mounted on the two surfaces of a printed circuit board in the same manner as described above such that they are shifted from each other between the upper and lower surfaces, it causes very complicated thermal deformation, as will be described later. Accordingly, a very high stress locally acts to decrease the service life of specific ball electrodes. This shortens the service life as the semiconductor packages.

The mounting method described in Japanese Patent Laid-Open No. 9-162241 requires the reinforcing bumps, and the mounting method described in Japanese Patent Laid-Open No. 2001-326322 requires the additional reinforcing plates. Consequently, the manufacturing cost increases greatly, which is not realistic.

SUMMARY OF THE INVENTION

The present invention has been made in view of the above problems, and has as its object to decrease the stress acting on the ball electrode portions of the semiconductor devices mounted on the two surfaces of the printed circuit board, thereby improving the bonding reliability of the semiconductor packages bonded to the printed circuit board.

According to the first aspect of the present invention, there is provided a semiconductor apparatus comprising a printed circuit board, a peripheral type first semiconductor package which has a first group of ball electrodes arranged in a peripheral type first arrangement area and a first group of additional ball electrodes arranged in part of an area inside the first arrangement area and which is arranged on a first surface of the printed circuit board, and a peripheral type second semiconductor package which has a second group of ball electrodes arranged in a peripheral type second arrangement area and a second group of additional ball electrodes arranged in part of an area inside the second arrangement area and which is arranged on a second surface of the printed circuit board, wherein a ball electrode located at at least one corner of the first group of ball electrodes is arranged at a position to oppose the second group of additional ball electrodes through the printed circuit board, and a ball electrode located at at least one corner of the second group of ball electrodes is arranged at a position to oppose the first group of additional ball electrodes through the printed circuit board.

According to the second aspect of the present invention, there is provided a semiconductor apparatus comprising a printed circuit board, a peripheral type first semiconductor package which has a first group of ball electrodes arrayed in a peripheral type first arrangement area and a first group of additional ball electrodes arranged in part of an area inside the first arrangement area and which is arranged on a first surface of the printed circuit board, and a second semiconductor package which has a second group of ball electrodes arranged in a second arrangement area and which is arranged on a second surface of the printed circuit board, wherein a ball electrode located at at least one corner of the second group of ball electrodes is arranged at a position to oppose the first group of additional ball electrodes through the printed circuit board.

Other features and advantages of the present invention will be apparent from the following description taken in conjunction with the accompanying drawings, in which like reference characters designate the same or similar parts throughout the figures thereof.

BRIEF DESCRIPTION OF THE DRAWINGS

The accompanying drawings, which are incorporated in and constitute a part of the specification, illustrate embodiments of the invention and, together with the description, serve to explain the principles of the invention.

DETAILED DESCRIPTION OF THE PREFERRED EMBODIMENTS

Figure 10A:
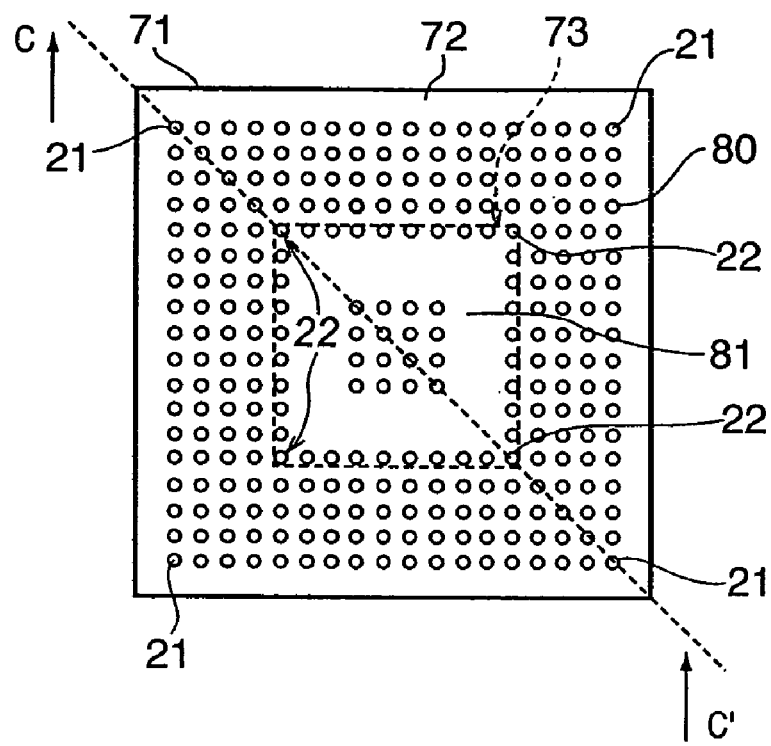
FIG. 10A is a plan view seen from the ball electrode side of a semiconductor package.
Figure 10B:
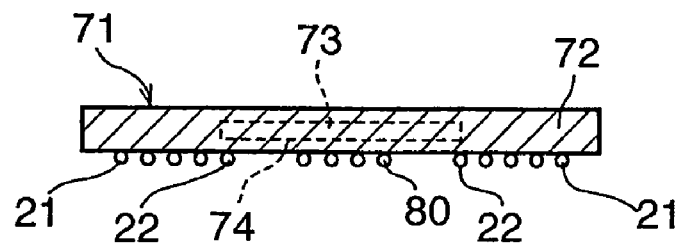
FIG. 10B is a sectional view taken along the line of arrows C-C' of the semiconductor package of FIG. 10A.

Prior to explaining the preferred embodiments of the present invention, a phenomenon will be explained wherein a semiconductor package is deformed by heat. FIG. 10A is a plan view seen from the ball electrode side of a semiconductor package, and FIG. 10B is a sectional view taken along the line of arrows C-C' of the semiconductor package of FIG. 10A.

A semiconductor package 71 comprises a package mold 72, semiconductor device 73, semiconductor device connecting portion 74, and a plurality of ball electrodes 80. The semiconductor device 73 is packaged to be protected by the package mold 72. The material of the package mold 72 is not particularly limited and, e.g., an epoxy resin can be used.

Wirings to be connected to the plurality of ball electrodes 80 are formed at the semiconductor device connecting portion 74 in the package mold 72 (not shown). The plurality of ball electrodes 80 are arranged in the peripheral first area on the lower surface of the semiconductor package 71, as well as at the center of the second area inside the peripheral first area to form an island.

The semiconductor device 73 is connected to the semiconductor device connecting portion 74 through a plurality of electrodes (not shown) arranged on the lower surface of the semiconductor device 73. The material of the semiconductor device 73 is not particularly limited and, e.g., silicon can be used.

The plurality of ball electrodes 80 serve to electrically connect a printed circuit board to the semiconductor device 73.

Figure 12:
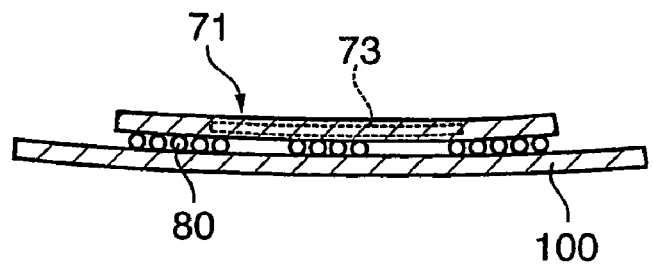
FIG. 12 is a side view showing a state wherein a printed circuit board, on one surface of which a conventional semiconductor package is mounted, thermally deforms.

FIG. 12 is a side view showing a state wherein a printed circuit board, on one surface of which the semiconductor package shown in FIG. 10 is mounted, thermally deforms.

The semiconductor package 71 which is mounted on a printed circuit board 100 as shown in FIG. 12 will be examined. The coefficient of thermal expansion of the semiconductor package 71 and that of the printed circuit board 100 on which the semiconductor package 71 is mounted will be compared. Assume that the semiconductor package 71 is made of silicon, that the package mold of the semiconductor package 71 is made of an epoxy resin, and that the printed circuit board 100 on which the semiconductor package 71 is to be mounted is made of a glass-epoxy resin. In this case, the coefficient of thermal expansion of silicon is lower than those of the epoxy resin and glass-epoxy resin by about an order of magnitude. The coefficient of thermal expansion of the epoxy resin and that of the glass-epoxy resin are not always equal.

Therefore, when the semiconductor package 71 or the like generates heat to increase the temperature of the package mold 72, the elongation of the printed circuit board 100 becomes larger than that of the package mold 72 which incorporates the semiconductor device 73 having the small coefficient of thermal expansion. A stress acts on the ball electrode portions 80 accordingly. At this time, the printed circuit board 100 warps as shown in FIG. 12 to relax the stress acting on the ball electrode portions 80. When the power supply is turned off and the semiconductor package 71 or the like no longer generates heat, the printed circuit board 100 and semiconductor package 71 shrink and the warp of the printed circuit board 100 disappears. In this manner, when the stress repeatedly acts on the ball electrode portions 80 which connect the package mold 72 to the printed circuit board 100, strain is accumulated in the ball electrode portions 80 to lead to a fracture.

At this time, the largest stress acts on, of the plurality of ball electrode portions 80, outermost ball electrodes 21 which are arranged on the four corners of the package mold 72. This is because thermal expansion increases proportionally to the length. More specifically, the outermost ball electrodes 21 arranged at the four corners are adversely affected by thermal expansion having a length corresponding to the diagonal of the package mold 72, so that the largest stress acts on the outermost ball electrodes 21.

A locally large stress also acts on ball electrodes 22 arranged at the boundary of the semiconductor device 73 and package mold 72. This is because the stress caused by the thermal expansion of the package mold 72 to act on the ball electrodes 22 which are arranged at the boundary of the semiconductor device 73 and package mold 72 is constrained by the semiconductor device 73 which has the small coefficient of thermal expansion. Accordingly, the difference in thermal expansion between the printed circuit board 100 having large thermal expansion and the ball electrodes 22 increases, so that the stress undesirably focuses on the ball electrodes 22.

Therefore, the ball electrodes 21 and 22 have a short service life and reach fracture the soonest.

Figure 13:
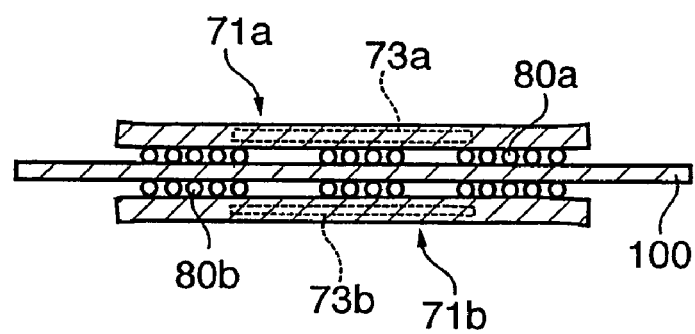
FIG. 13 is a side view showing a state wherein thermal deformation occurs with semiconductor packages being respectively mounted on the two surfaces of a printed circuit board.

FIG. 13 is a side view showing a state wherein thermal deformation occurs with the semiconductor packages each shown in FIG. 10 being respectively mounted on the two surfaces of a printed circuit board.

Referring to FIG. 13, conventional semiconductor packages 71a and 71b having the same shape are respectively mounted on the two surfaces of a printed circuit board 100 such that they overlap each other 100%. Semiconductor packages 71a and 71b include semiconductor devices 73a and 73b, respectively. In this case, due to the mutual interference of the semiconductor packages 71a and 71b, the printed circuit board 100 cannot warp unlike in a case wherein a semiconductor package is mounted on only its one surface. Hence, the stress acting on ball electrodes 80a and 80b cannot be relaxed, and the service life of the ball electrodes 80a and 80b becomes shorter than in a case shown in FIG. 12 wherein the semiconductor package is mounted on only the one surface of the printed circuit board 100.

Figure 14:
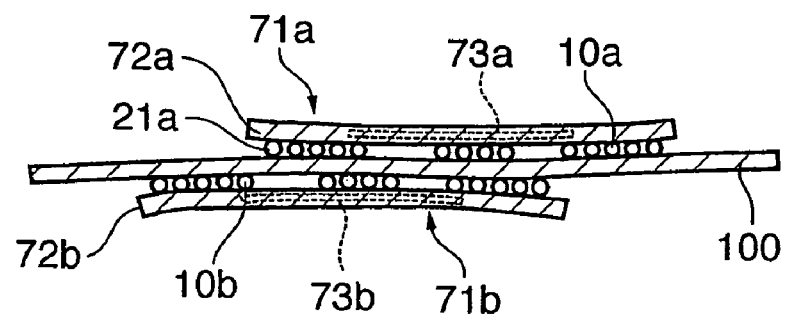
FIG. 14 is a sectional view showing a state wherein thermal deformation occurs with semiconductor packages being respectively mounted on the two surfaces of a printed circuit board.

FIG. 14 is a sectional view showing a state wherein thermal deformation occurs with the semiconductor packages each shown in FIGS. 10A and 10B being respectively mounted on the two surfaces of a printed circuit board. FIG. 14 corresponds to FIG. 11B which shows a sectional view taken along the line of arrows D-D' of FIG. 11A.

Figure 11A:
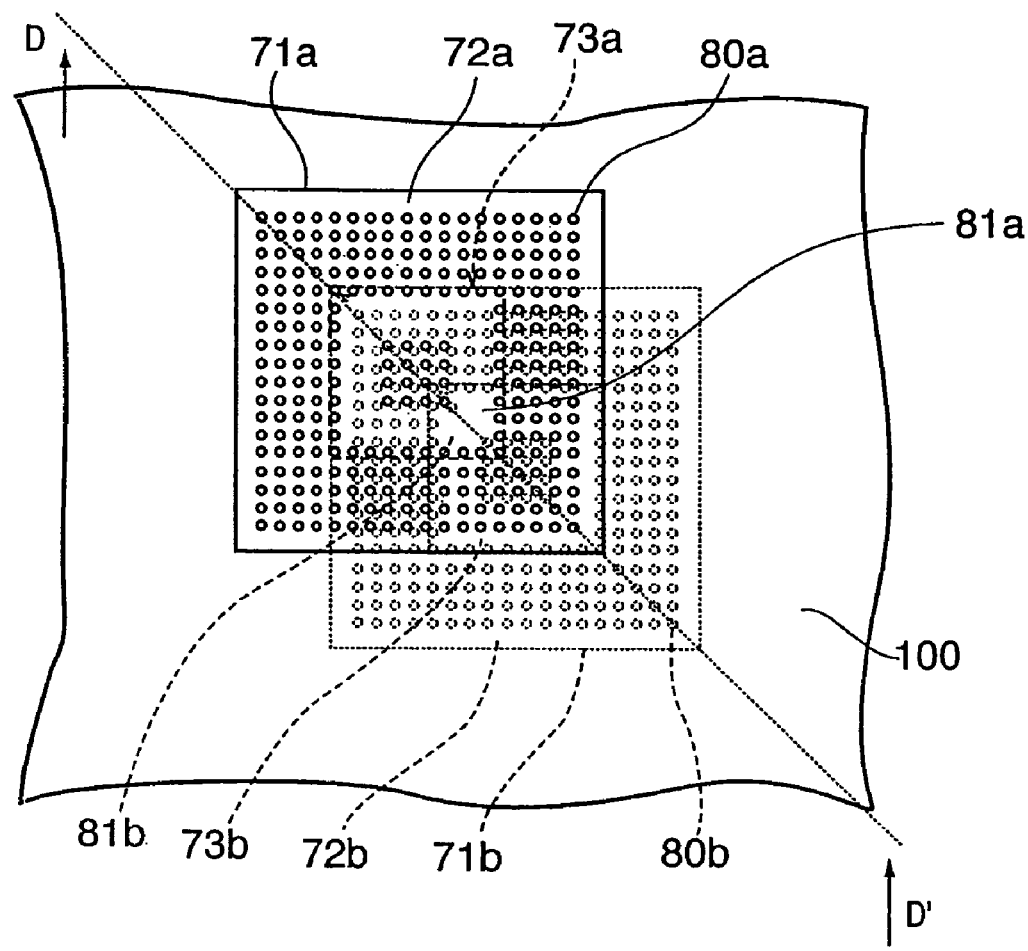
FIG. 11A is a plan view seen from the ball electrode side of semiconductor packages.
Figure 11B:
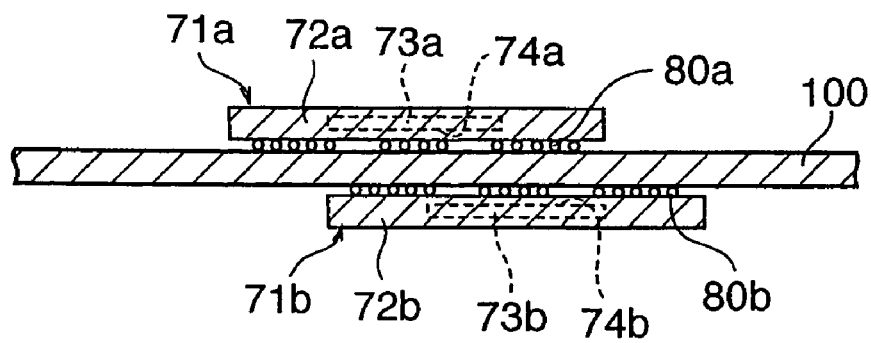
FIG. 11B is a sectional view taken along the line of arrows D-D' of the semiconductor packages of FIG. 11A.

FIG. 14 shows a state wherein semiconductor packages 71a and 71b on the two surfaces of the printed circuit board overlap such that they are displaced from each other substantially by 25% in the oblique direction, as shown in the plan view of FIG. 11A. Different from the state wherein semiconductor packages overlap each other 100%, complicated thermal deformation occurs.

Where a semiconductor package is present on the opposite side of a printed circuit board 100, a warp does not occur readily due to mutual interference. Where no semiconductor package is present on the opposite side, interference does not occur and accordingly a warp occurs.

An explanation will be made on the left half of FIG. 14. Outermost ball electrodes 21a of the semiconductor package 71a mounted on the upper surface of the printed circuit board 100 are located where ball electrodes 1ob of the semiconductor package 71b mounted on the lower surface of the printed circuit board 100 are not present.

A stress acts on the outermost ball electrodes 21a due to a difference in thermal expansion between the semiconductor package 71a and printed circuit board 100. At this time, the printed circuit board 100 is constrained by the semiconductor package 71b mounted on its lower surface, and cannot warp to relax the stress.

The left half of the semiconductor package 71b arranged on the lower surface of the semiconductor package 71a thermally expands largely due to the difference in thermal expansion. As no member that constrains elongation is present at that portion of the printed circuit board 100 which corresponds to the left half of the semiconductor package 71b, the printed circuit board 100 warps downward. As a result, a larger stress acts on the outermost ball electrodes 21a than in the case shown in FIG. 13.

As the coefficient of thermal expansion of the package molds 72a and 72b is largely different from that of the semiconductor devices 73a and 73b, a local stress acts on a ball electrode which opposes an edge of the semiconductor devices 73a and 73b incorporated in the semiconductor packages 71a and 71b. The printed circuit board 100 accordingly warps largely at the edge of the semiconductor devices 73a and 73b. Therefore, when the outermost ball electrode 21a of the semiconductor package 71a opposes an edge of the semiconductor device 73b of the semiconductor package 71b, a very large stress acts on the outermost ball electrode 21a. The same phenomenon also occurs in the right half of FIG. 14 with only the vertical relationship being reversed.

According to a preferred embodiment of the present invention, when semiconductor packages are respectively mounted on the two surfaces of a printed circuit board, as described above, the stress generated in the outermost ball electrode arranged in the semiconductor package and in the ball electrodes in the vicinities of the outermost ball electrode is decreased, thereby improving the bonding reliability of the semiconductor packages bonded to the printed circuit board.

Preferred embodiments of the present invention will now be described in detail in accordance with the accompanying drawings. The embodiments to be described hereinafter are suitable practical examples of the present inventions, and technically preferable various limitations are imposed on the embodiments. Note that the present invention is not limited to these specific embodiments except as defined in the specification.

First Embodiment

Figure 1A:
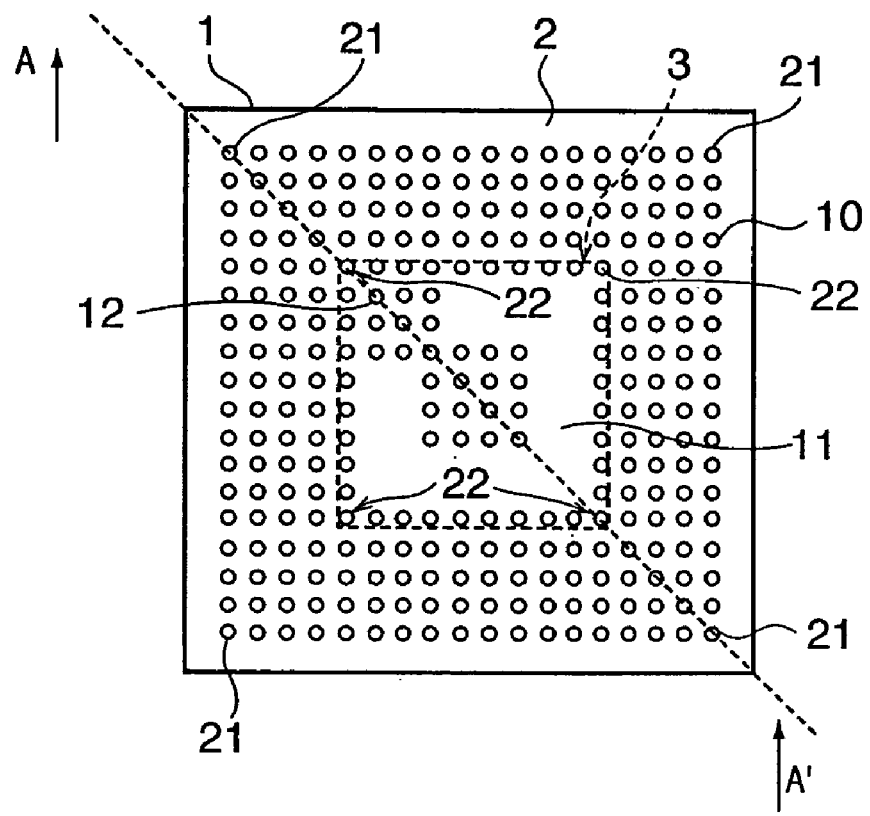
FIG. 1A is a plan view seen from the ball electrode side of a semiconductor device according to the first preferred embodiment of the present invention.
Figure 1B:
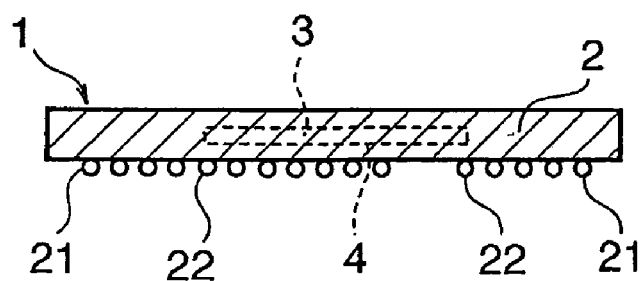
FIG. 1B is a sectional view taken along the line of arrows A-A' of the semiconductor package of FIG. 1A.

FIG. 1A is a plan view seen from the ball electrode side of a semiconductor package according to the first preferred embodiment of the present invention, and FIG. 1B is a sectional view taken along the line of arrows A-A' of the semiconductor package of FIG. 1A.

A semiconductor package 1 according to the first preferred embodiment of the present invention comprises a package mold 2, semiconductor device 3, semiconductor device connecting portion 4, a plurality of ball electrodes 10, and a plurality of additional ball electrodes (to be referred to as additional ball electrodes hereinafter) 12. The additional ball electrodes 12 can be either electrodes that function electrically in the semiconductor apparatus or electrodes that do not function electrically in the semiconductor apparatus.

Wirings to be connected to the plurality of ball electrodes 10 are formed at the semiconductor device connecting portion 4 in the package mold 2 (not shown).

The semiconductor device 3 is packaged to be protected by the package mold 2. The material of the package mold 2 is not particularly limited and, e.g., an epoxy resin can be used.

The semiconductor device 3 is connected to the semiconductor device connecting portion 4 through a plurality of electrodes (not shown) arranged on the lower surface of the semiconductor device 3. The material of the semiconductor device 3 is not particularly limited and, e.g., silicon can be used.

The plurality of ball electrodes 10 serve to electrically connect a printed circuit board to the semiconductor device 3. As shown in FIG. 1A, the plurality of ball electrodes 10 are arranged substantially in an array on the lower surface of the package mold 2.

The semiconductor package 1 is a peripheral type semiconductor package. More specifically, the plurality of ball electrodes 10 are arranged in the peripheral first area on the lower surface of the semiconductor package 1, as well as at the center of the second area inside the peripheral first area to form an island. The second area has an area 11 where no ball electrodes are present. Accordingly, in the area 11, the printed circuit board is not electrically connected to the semiconductor device 3.

The plurality of additional ball electrodes 12 are formed at arbitrary portions on the diagonal of the area 11 where the plurality of ball electrodes 10 are not present. Ball electrodes 22 are arranged at the edges of the semiconductor device 3. The ball electrodes 10 and 22 and additional ball electrodes 12 are arranged on a plurality of lands (not shown) formed on the semiconductor package 1. The plurality of lands can be formed by patterning a metal such as copper on the semiconductor package 1. The material of the plurality of ball electrodes 10 and plurality of additional ball electrodes 12 are not particularly limited and, e.g., lead-free solder can be used.

Figure 2A:
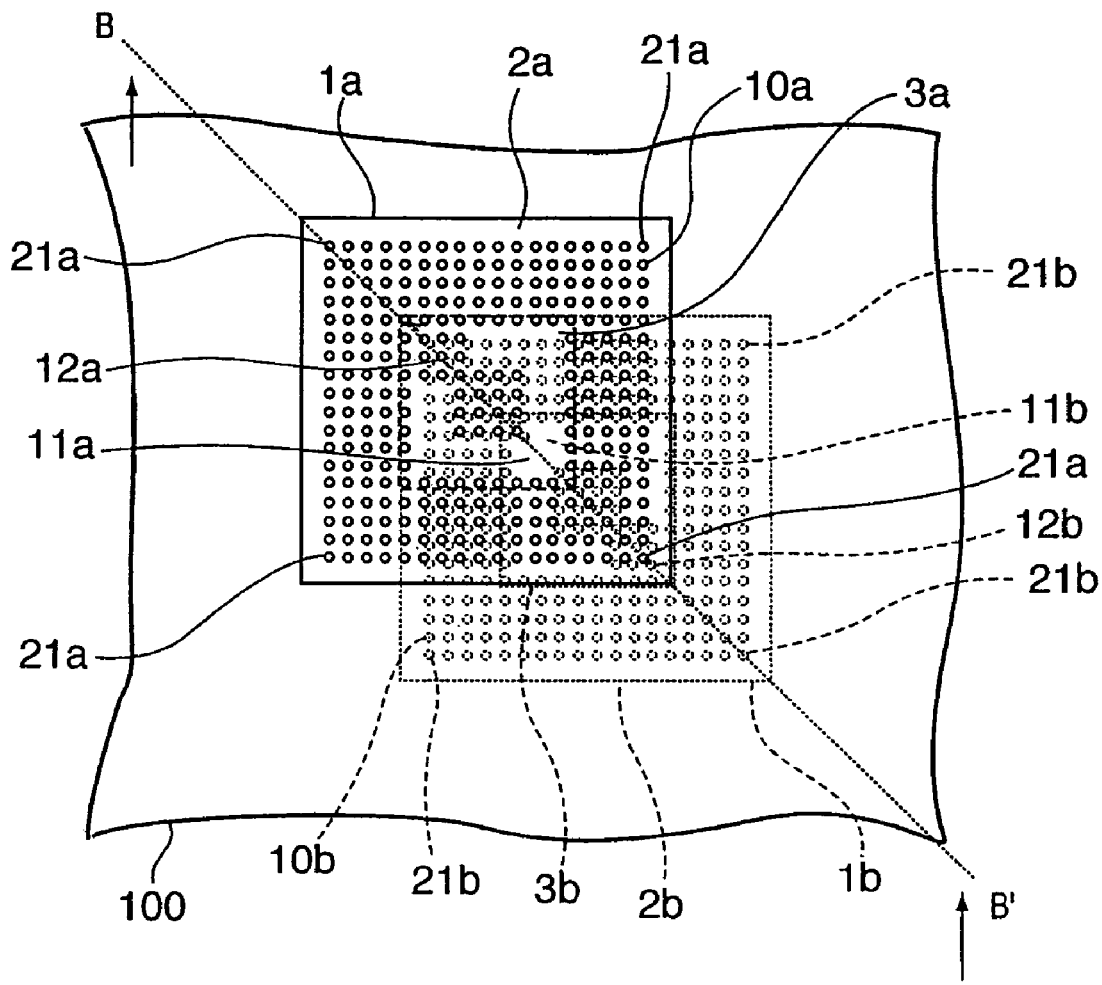
FIG. 2A is a plan view showing a state wherein semiconductor apparatuses according to the first preferred embodiment of the present invention are respectively mounted on the two surfaces of a printed circuit board.
Figure 2B:
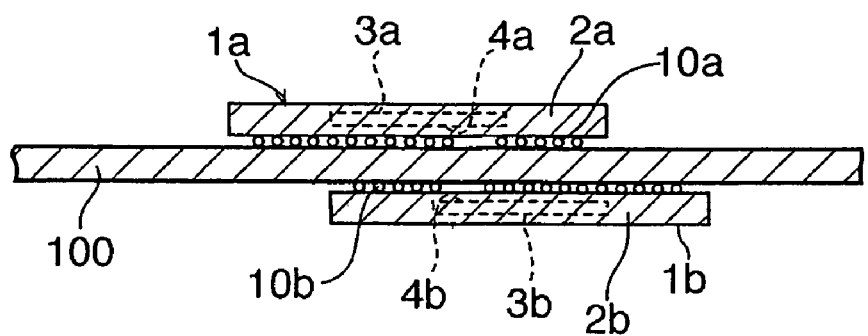
FIG. 2B is a sectional view taken along the line of arrows B-B' of the semiconductor packages of FIG. 2A.

FIG. 2A is a plan view showing a state wherein semiconductor apparatuses according to the first preferred embodiment of the present invention are respectively mounted on the two surfaces of a printed circuit board, and FIG. 2B is a sectional view taken along the line of arrows B-B' of the semiconductor packages of FIG. 2A.

A printed circuit board 100 on which semiconductor packages 1a and 1b are to be mounted has array-like terminals (not shown) at positions corresponding to a plurality of ball electrodes 10a and 10b and a plurality of additional ball electrodes 12a and 12b of package molds 2a and 2b. The package molds 2a and 2b are bonded on the printed circuit board 100 through the plurality of the ball electrodes 10a and 10b, as shown in FIG. 2B. The materials of the package molds 2a and 2b are not particularly limited and, e.g., a glass-epoxy resin can be used.

The semiconductor package 1a is mounted on one surface of the printed circuit board 100 through the plurality of ball electrodes 10a, and the semiconductor package 1b is mounted on the other surface of the printed circuit board 100 through the plurality of ball electrodes 10b.

Of the ball electrodes of the semiconductor package 1a, one outermost ball electrode 21a is arranged to oppose the plurality of additional ball electrodes 12b of the semiconductor package 1b. Similarly, of the ball electrodes of the semiconductor package 1b, one additional ball electrode 21b is arranged to oppose the plurality of additional ball electrodes 12a of the semiconductor package 1a.

Thermal deformation depending on the shape of the semiconductor package according to the first preferred embodiment of the present invention will be described.

Figure 3:
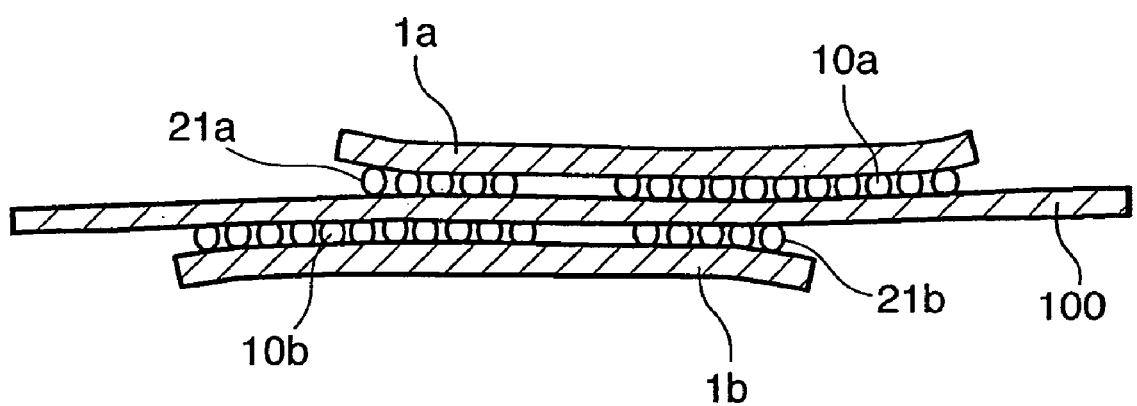
FIG. 3 is a sectional view showing a state wherein thermal deformation occurs with the semiconductor packages being respectively mounted on the two surfaces of the printed circuit board.

FIG. 3 is a sectional view showing a state wherein thermal deformation occurs in a semiconductor apparatus shown in FIGS. 2A and 2B in which the semiconductor packages are respectively mounted on the two surfaces of the printed circuit board.

Where the semiconductor package is present on the opposite side of the printed circuit board 100, the printed circuit board 100 does not readily warp due to mutual interference. Where no semiconductor package is present on the opposite side, interference does not occur and accordingly a warp occurs.

An explanation will be made on the left half of FIG. 3. Different from the case of FIGS. 11A and 11B, of the plurality of ball electrodes 10a of the semiconductor package 1a, the outermost ball electrodes 21a which are located on a corner of the area of the ball electrodes 10a are arranged to oppose the plurality of ball electrodes 10b of the semiconductor package 1b. Of the plurality of ball electrodes 10b of the semiconductor package 1b, the outermost ball electrode 21b located at a corner of the area of the ball electrodes 10b are arranged to oppose the plurality of ball electrodes 10a of the semiconductor package 1a. Hence, the stress acting on the outermost ball electrodes is dispersed to the opposing ball electrodes through the printed circuit board. Therefore, the package mold does not warp sharply but deforms smoothly.

Therefore, no large stress acts on the outermost ball electrodes 21a and 21b of the semiconductor packages 1a and 1b which are respectively mounted on the two surfaces of the printed circuit board 100. Consequently, the durability of the outermost ball electrodes 21a and 21b increase largely.

At this time, ball electrodes 22 are arranged at positions to oppose an edge of the semiconductor device 3 incorporated in the semiconductor package 1a. The ball electrodes 22 are arranged to oppose through the printed circuit board 100 any one of the ball electrodes 21b of the semiconductor package 1b. Similarly, other ball electrodes 22 are also arranged at positions opposing the edges of the semiconductor device 3 of the semiconductor package 1b. These ball electrodes 22 are also arranged to oppose through the printed circuit board 100 any one of the ball electrodes 21a of the semiconductor package 1a.

Thus, the warp of the semiconductor packages 1a and 1b is further suppressed, so that the stress acting on the outermost ball electrodes 21a and 21b can be suppressed.

The same phenomenon also occurs in the right half of FIG. 3 with only the vertical relationship being reversed. A stress as large as that in the conventional case does not act on the outermost ball electrodes 21a and 21b.

As described above, according to this embodiment, the stresses to act on the ball electrode portions of the semiconductor packages mounted on the two surfaces of the printed circuit board are decreased to improve the bonding reliability.

When the semiconductor apparatus of the embodiment shown in FIGS. 2A and 2B was subjected to a destructive test, it fractured after about 1,100 cycles. When the semiconductor apparatus shown in FIG. 14 was similarly subjected to a fracture test, it fractured after about 900 cycles.

Accordingly, in this embodiment, the durability is largely improved when compared to the case shown in FIG. 14.

Second Embodiment

Figure 4A:
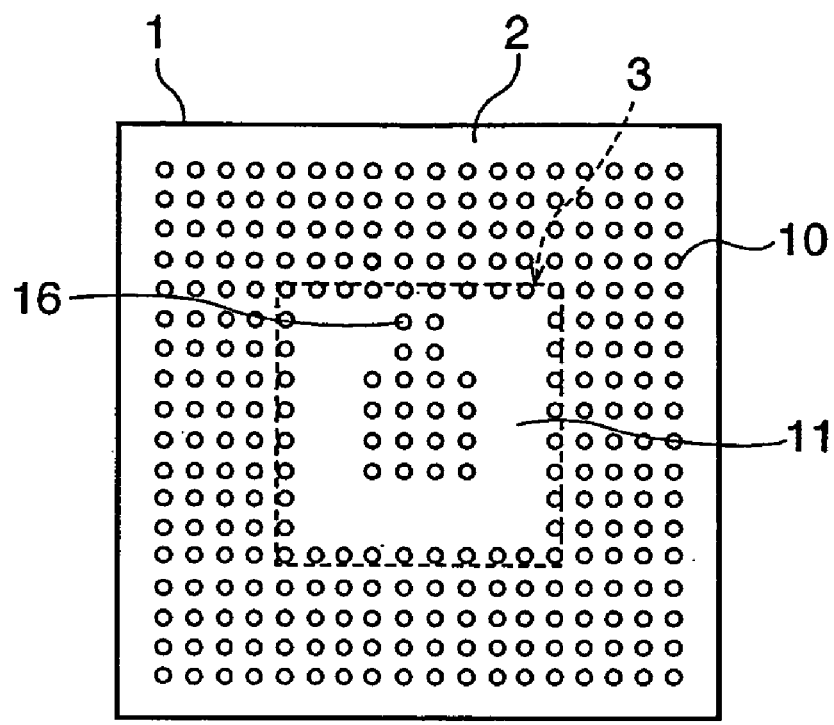
FIG. 4A is a plan view seen from the ball electrode side of a semiconductor package according to the second preferred embodiment of the present invention.
Figure 4B:
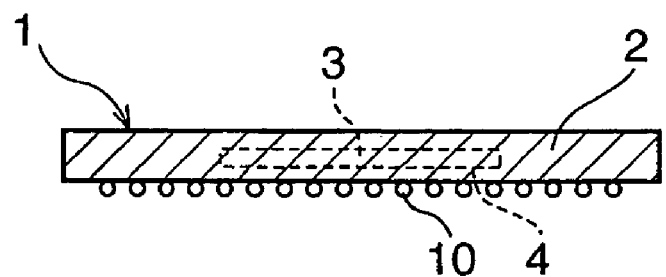
FIG. 4B is a side view of the semiconductor package of FIG. 4A.

A semiconductor apparatus according to the second embodiment of the present invention will be described. FIG. 4A is a plan view seen from the ball electrode side of a semiconductor package according to the second preferred embodiment of the present invention, and FIG. 4B is a side view of the semiconductor package of FIG. 4A. The semiconductor apparatus according to the second embodiment has a structure obtained by changing part of the structure of the semiconductor apparatus according to the first embodiment. More specifically, in the semiconductor package according to this embodiment, a plurality of additional ball electrodes 16 are formed at that portion of an area 11 where no ball electrodes 10 are present excluding corners. The ball electrodes 10 and the additional ball electrodes 16 are arranged on a plurality of lands (not shown) formed on the semiconductor package. The plurality of lands can be formed by patterning a metal such as copper on the semiconductor package 1.

The materials of the plurality of ball electrodes 10 and plurality of additional ball electrodes 16 are not particularly limited and, e.g., lead-free solder can be used.

Figure 5A:
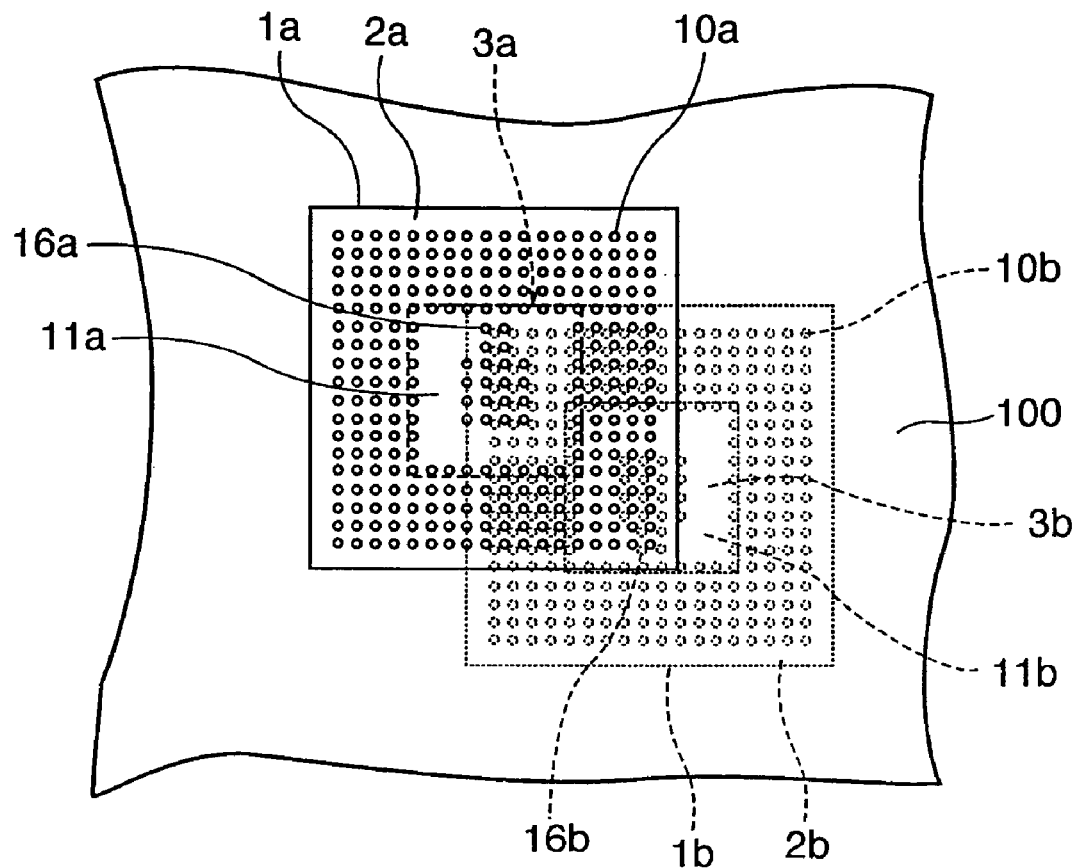
FIG. 5A is a plan view seen from the ball electrode side of a semiconductor apparatus according to the second embodiment of the present invention.
Figure 5B:
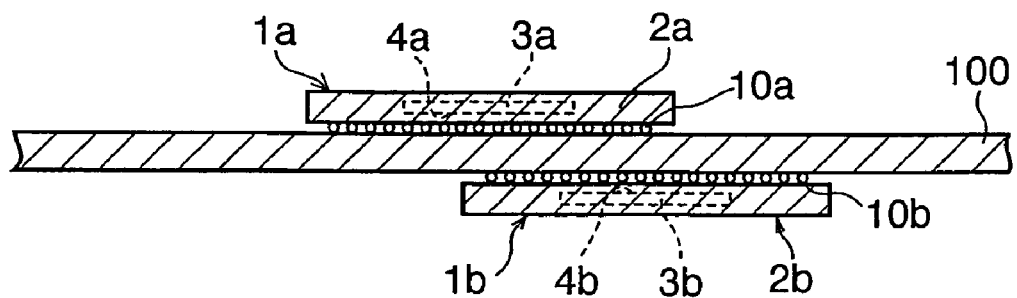
FIG. 5B is a side view of the semiconductor apparatus of FIG. 5A.

FIG. 5A is a plan view seen from the ball electrode side of a semiconductor apparatus according to the second embodiment of the present invention, and FIG. 5B is a side view of the semiconductor apparatus of FIG. 5A.

A printed circuit board 100 on which semiconductor packages are to be mounted has array-like terminals (not shown) at positions corresponding to a plurality of ball electrodes 10a and 10b and a plurality of additional ball electrodes 16a and 16b of package molds 2a and 2b. The package molds 2a and 2b are bonded on the printed circuit board 100 through the solder of the plurality of the ball electrodes 10a and 10b, as shown in FIG. 5B.

As shown in FIG. 5A, the semiconductor packages mounted on the two surfaces of the printed circuit board 100 have substantially the same shapes. The positions relative to each other of the semiconductor packages on the two surfaces are as shown in FIG. 5A.

Of the plurality of ball electrodes 10a of the semiconductor package 1a, an outermost ball electrode which is located at a corner of the ball electrode area is arranged to oppose the additional ball electrodes 16b of the semiconductor package 1b mounted through the printed circuit board 100. Hence, even if the semiconductor packages 1a and 1b mounted on the two surfaces of the printed circuit board 100 are arranged at portions other than on substantially their diagonal directions through the printed circuit board 100, the stress acting on the ball electrode portion can be decreased to improve the bonding reliability.

Third Embodiment

Figure 6A:
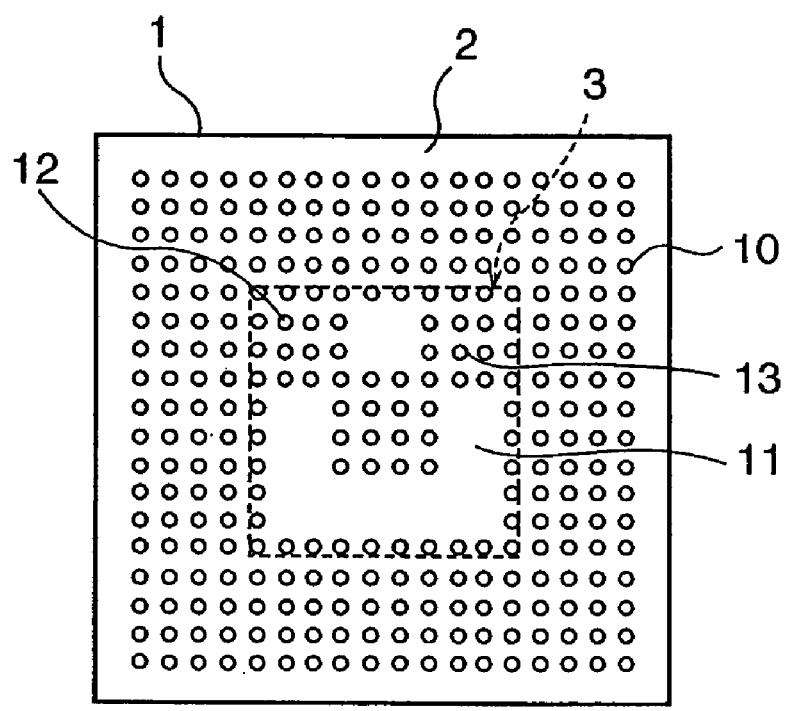
FIG. 6A is a plan view seen from the ball electrode side of a semiconductor apparatus according to the third embodiment of the present invention.
Figure 6B:
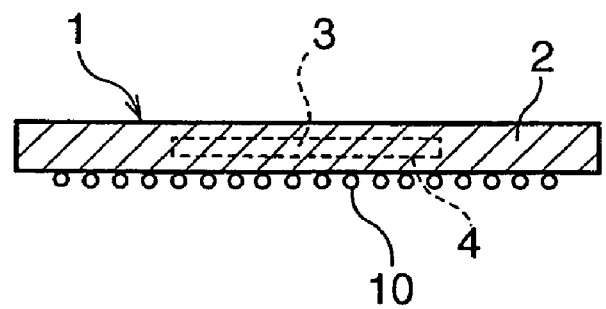
FIG. 6B is a side view of the semiconductor apparatus of FIG. 6A.

A semiconductor apparatus according to the third embodiment of the present invention will be described. FIG. 6A is a plan view seen from the ball electrode side of the semiconductor apparatus according to the third embodiment of the present invention, and FIG. 6B is a side view of the semiconductor apparatus of FIG. 6A.

A semiconductor package 1 in the semiconductor apparatus according to the third preferred embodiment of the present invention comprises a package mold 2, semiconductor device 3, semiconductor device connecting portion 4, a plurality of ball electrodes 10, a plurality of first additional ball electrodes 12, and a plurality of second additional ball electrodes 13.

Wirings (not shown) which connect the semiconductor package 1 to the plurality of ball electrodes 10 when necessary are formed at the semiconductor device connecting portion 4 in the package mold 2.

The semiconductor device 3 is connected to the semiconductor device connecting portion 4 through a plurality of electrodes (not shown) arranged on the lower surface of the semiconductor device 3. The material of the semiconductor device 3 is not particularly limited and, e.g., silicon can be used.

The semiconductor device 3 is packaged to be protected by the package mold 2. The material of the package mold 2 is not particularly limited and, e.g., an epoxy resin can be used.

As shown in FIG. 6A, the plurality of ball electrodes 10 are arranged substantially in an array on the lower surface of the package mold 2. The semiconductor apparatus according to the third preferred embodiment of the present invention is a peripheral type semiconductor package in which the plurality of ball electrodes 10 are not arranged on the entire lower surface of the package mold 2 and are accordingly absent in some of an area 11.

The plurality of additional ball electrodes 12 and 13 are formed at two portions on the diagonals of the area 11 where no ball electrodes 10 are present. The ball electrodes 10 and additional ball electrodes 12 and 13 are arranged on a plurality of lands (not shown) formed on the semiconductor package 1. The plurality of lands can be formed by patterning a metal such as copper on the semiconductor package 1.

The materials of the plurality of ball electrodes 10 and plurality of additional ball electrodes 12 and 13 are not particularly limited, and e.g., lead-free solder can be used.

Figure 7A:
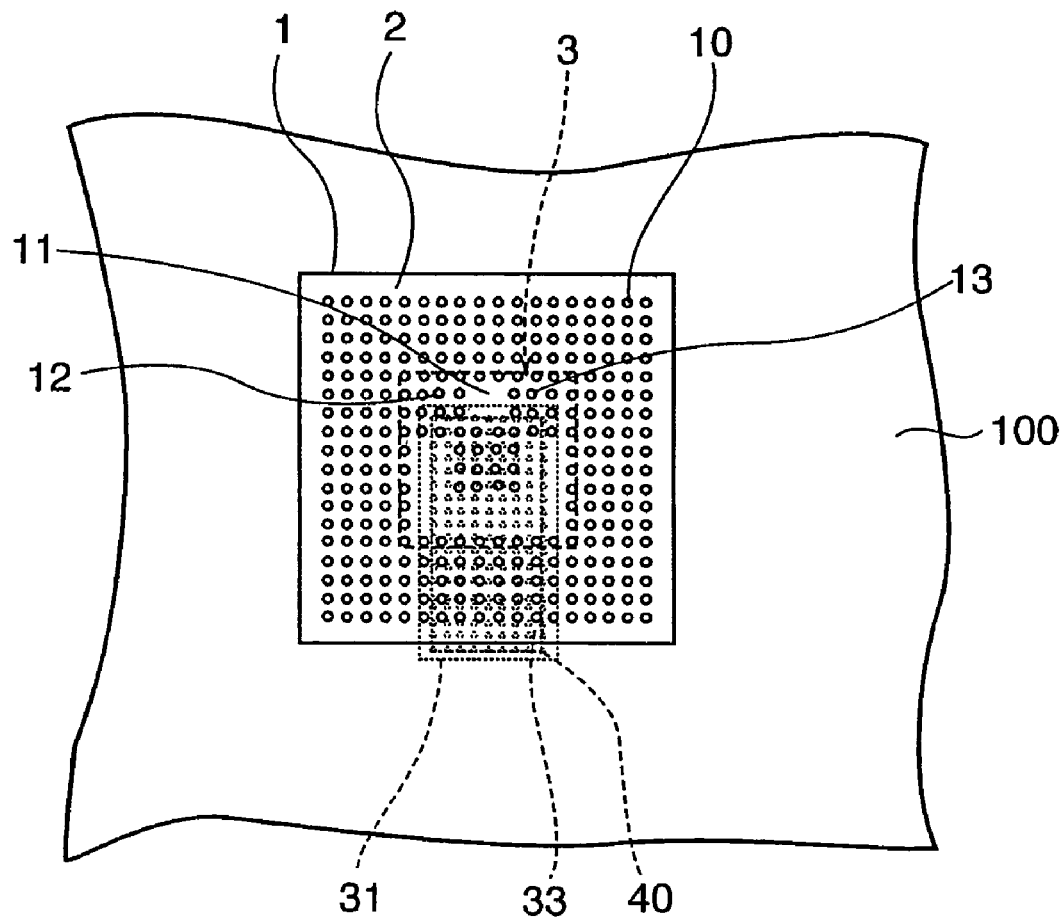
FIG. 7A is a plan view showing a state wherein semiconductor apparatuses according to the third preferred embodiment of the present invention are mounted on a printed circuit board.
Figure 7B:
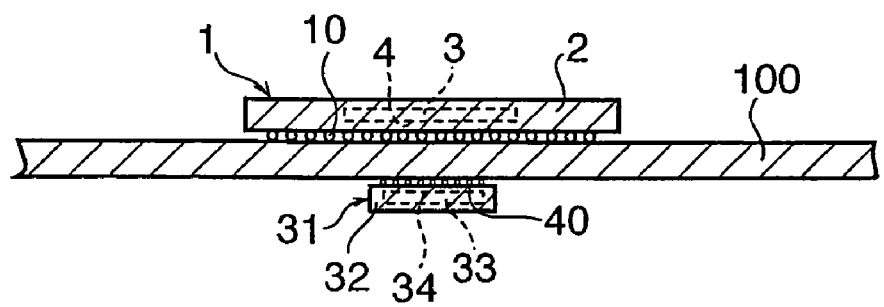
FIG. 7B is a side view of the semiconductor apparatuses of FIG. 7A.

FIG. 7A is a plan view showing a state wherein semiconductor apparatuses according to the third preferred embodiment of the present invention are mounted on a printed circuit board, and FIG. 7B is a side view of the semiconductor apparatuses of FIG. 7A.

A printed circuit board 100 on which semiconductor packages are to be mounted has array-like terminals (not shown) at positions corresponding to the plurality of ball electrodes 10 and plurality of additional ball electrodes 12 and 13 of the package mold 2. The printed circuit board 100 is bonded to the package mold 2 through the solder of the plurality of the ball electrodes 10, as shown in FIG. 7B. The material of the package mold 2 is not particularly limited and, e.g., a glass-epoxy resin can be used.

As shown in FIG. 7A, the semiconductor packages mounted on the two surfaces of the printed circuit board 100 have different shapes. A semiconductor package 31 mounted on the lower surface of the printed circuit board 100 has a smaller width than that of a semiconductor package 1 mounted on the upper surface of the printed circuit board 100. The positions relative to each other of the two semiconductor packages respectively mounted on the two surfaces of the printed circuit board 100 are as shown in FIG. 7A.

Of the plurality of ball electrodes 10 of the semiconductor package 31 mounted on the lower surface of the printed circuit board 100, an outermost ball electrode which is located at a corner of the area of the ball electrodes 10 is arranged to oppose the plurality of additional ball electrodes 12 and 13 of the semiconductor package 1 mounted on the upper surface of the printed circuit board 100. Hence, the stress acting on the ball electrode portion of the small-width semiconductor packages mounted on the two surfaces of the printed circuit board can be decreased to improve the bonding reliability.

Fourth Embodiment

Figure 8A:
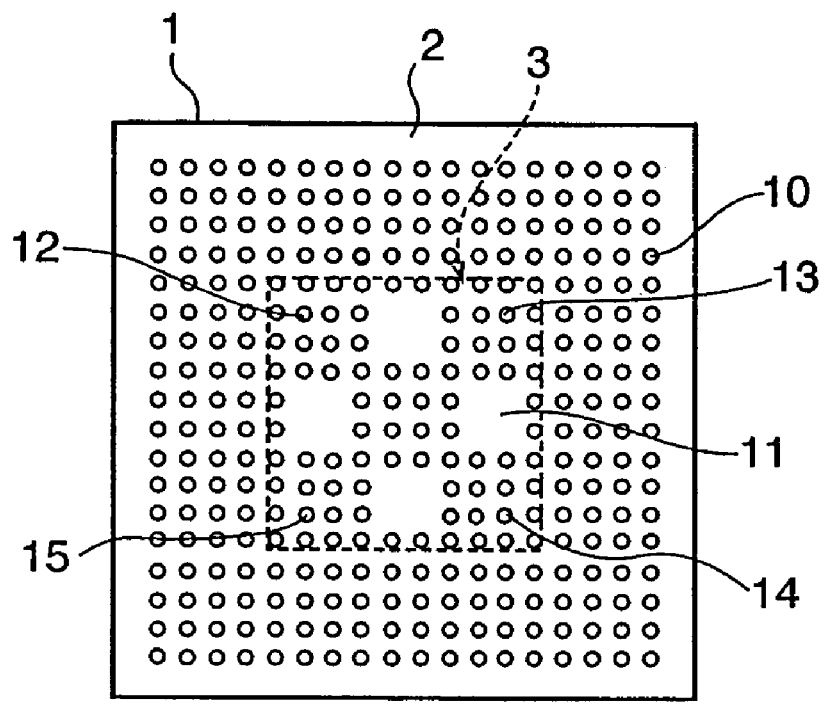
FIG. 8A is a plan view seen from the ball electrode side of a semiconductor apparatus according to the fourth preferred embodiment of the present invention.
Figure 8B:
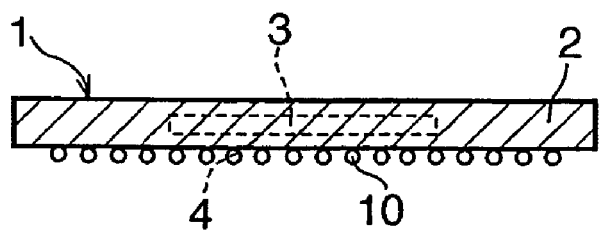
FIG. 8B is a side view of the semiconductor apparatus of FIG. 8B.

FIG. 8A is a plan view seen from the ball electrode side of a semiconductor apparatus according to the fourth preferred embodiment of the present invention, and FIG. 8B is a side view of the semiconductor apparatus of FIG. 8B.

A semiconductor package 1 in the semiconductor apparatus according to the fourth preferred embodiment of the present invention comprises a package mold 2, semiconductor device 3, semiconductor device connecting portion 4, a plurality of ball electrodes 10, a plurality of first additional ball electrodes 12, a plurality of second additional ball electrodes 13, a plurality of third additional ball electrodes 14, and a plurality of fourth additional ball electrodes 15.

Wirings (not shown) which connect the semiconductor package 1 to the plurality of ball electrodes 10 when necessary are formed at the semiconductor device connecting portion 4 in the package mold 2.

The semiconductor device 3 is connected to the semiconductor device connecting portion 4 through a plurality of electrodes (not shown) arranged on the lower surface of the semiconductor device 3. The material of the semiconductor device 3 is not particularly limited and, e.g., silicon can be used.

The semiconductor device 3 is packaged to be protected by the package mold 2. The material of the package mold 2 is not particularly limited and, e.g., an epoxy resin can be used.

As shown in FIG. 8A, the plurality of ball electrodes 10 are arranged substantially in an array on the lower surface of the package mold 2. The semiconductor apparatus according to the fourth preferred embodiment of the present invention is a peripheral type semiconductor package in which the plurality of ball electrodes 10 are not arranged on the entire lower surface of the package mold 2 and accordingly are absent in some of an area 11.

The plurality of additional ball electrodes 12, 13, 14, and 15 are formed at portions on the diagonals of the area 11 where no ball electrodes 10 are present. The ball electrodes 10 and additional ball electrodes 12, 13, 14 and 15 are arranged on a plurality of lands (not shown) formed on the semiconductor package 1. The plurality of lands can be formed by patterning a metal such as copper on the semiconductor package 1.

The materials of the plurality of ball electrodes 10 and plurality of additional ball electrodes 12, 13, 14, and 15 are not particularly limited, and e.g., lead-free solder can be used.

Figure 9A:
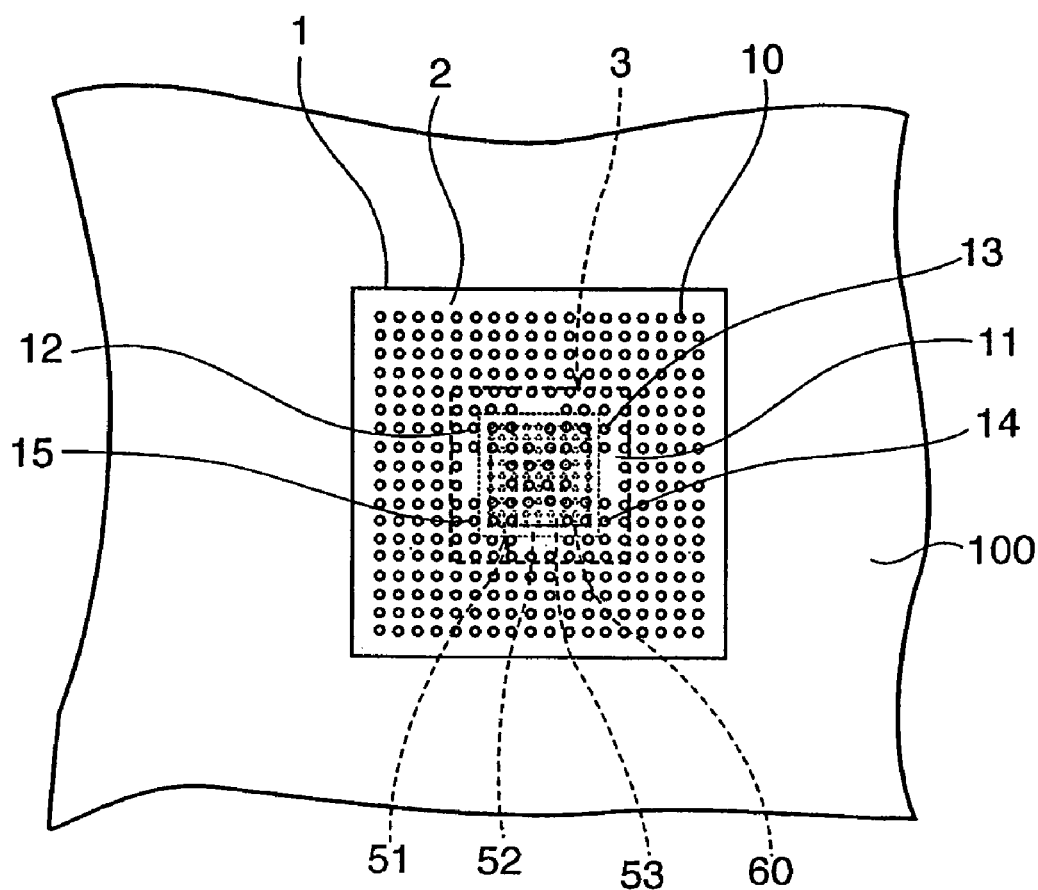
FIG. 9A is a plan view showing a state wherein semiconductor apparatuses according to the fourth preferred embodiment of the present invention are mounted on a printed circuit board.
Figure 9B:
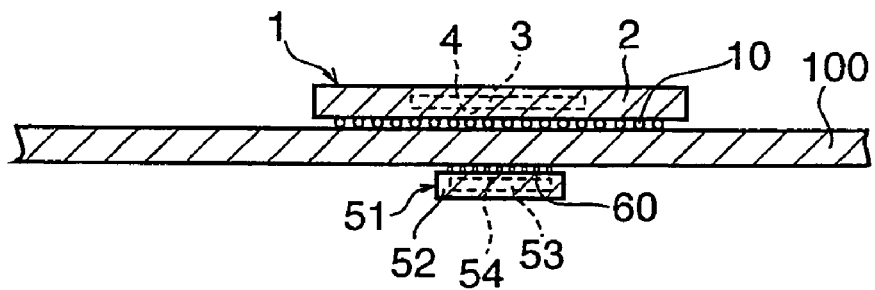
FIG. 9B is a side view of the semiconductor apparatuses of FIG. 9A.

FIG. 9A is a plan view showing a state wherein semiconductor apparatuses according to the fourth preferred embodiment of the present invention are mounted on a printed circuit board, and FIG. 9B is a side view of the semiconductor apparatuses of FIG. 9A.

A printed circuit board 100 on which semiconductor packages are to be mounted has array-like terminals (not shown) at positions corresponding to the plurality of ball electrodes 10 and plurality of additional ball electrodes 12, 13, 14, and 15 of the semiconductor packages. The printed circuit board 100 is bonded to the package mold 2 through the solder of the plurality of the ball electrodes 10, as shown in FIG. 9B. The material of the package mold 2 is not particularly limited and, e.g., a glass-epoxy resin can be used.

As shown in FIG. 9A, the semiconductor packages mounted on the two surfaces of the printed circuit board 100 have different shapes. A semiconductor device 51 mounted on the lower surface of the printed circuit board 100 has smaller width and height than those of the semiconductor package 1 mounted on the upper surface of the printed circuit board 100. The positions relative to each other of the two semiconductor packages mounted on the two surfaces of the printed circuit board 100 are as shown in FIG. 9A.

The plurality of additional ball electrodes 12, 13, 14, and 15 of the semiconductor package 1 mounted on the upper surface of the printed circuit board 100 are arranged at positions opposing the outermost ball electrodes located at the corners of that area of the semiconductor package 51, mounted on the lower surface of the printed circuit board 100, where the plurality of ball electrodes 10 are arrayed. Hence, the stress acting on the ball electrode portions of the small-width, small-height semiconductor packages mounted on the two surfaces of the printed circuit board can be effectively decreased to improve the bonding reliability.

Fifth Embodiment

Figure 15A:
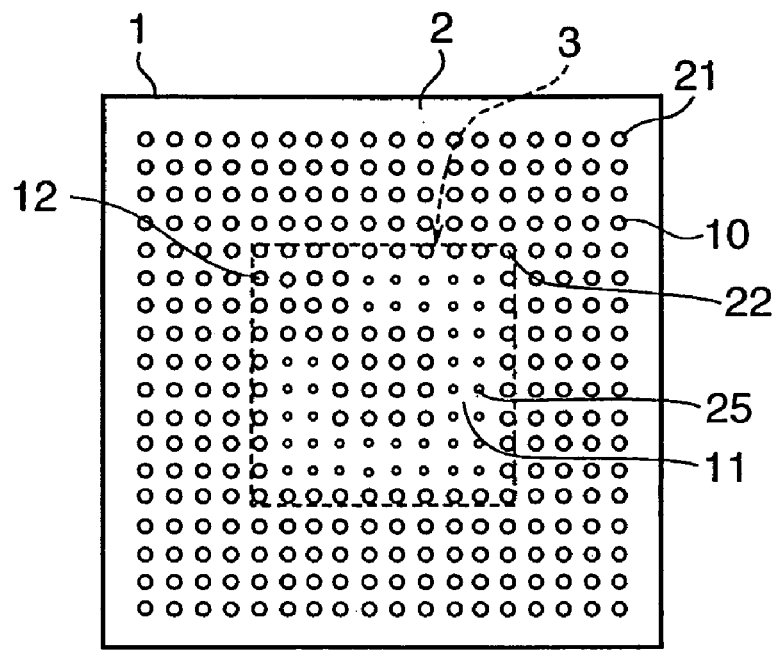
FIG. 15A is a plan view seen from the ball electrode side of a semiconductor apparatus according to the fifth preferred embodiment of the present invention.
Figure 15B:
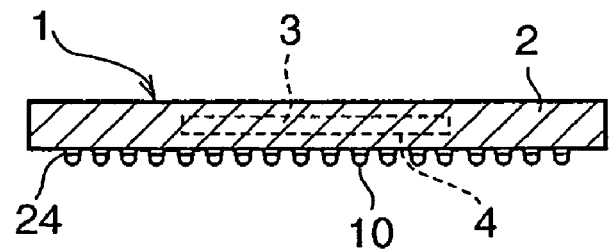
FIG. 15B is a side view of the semiconductor apparatus of FIG. 15A.

FIG. 15A is a plan view seen from the ball electrode side of a semiconductor apparatus according to the fifth preferred embodiment of the present invention, and FIG. 15B is a side view of the semiconductor apparatus of FIG. 15A.

A semiconductor package 1 in the semiconductor apparatus according to the fifth preferred embodiment of the present invention comprises a package mold 2, semiconductor device 3, semiconductor device connecting portion 4, a plurality of ball electrodes 10, a plurality of lands 24, a plurality of additional ball electrodes 12, and a plurality of additional lands 25.

Wirings (not shown) are formed at the semiconductor device connecting portion 4 in the package mold 2 to connect, when necessary, the semiconductor package 1 to the plurality of ball electrodes 10 connected to the semiconductor package 1 through the lands 24.

The semiconductor device 3 is connected to the semiconductor device connecting portion 4 through a plurality of electrodes (not shown) arranged on the lower surface of the semiconductor device 3. The material of the semiconductor device 3 is not particularly limited and, e.g., silicon can be used.

The semiconductor device 3 is packaged to be protected by the package mold 2. The material of the package mold 2 is not particularly limited and, e.g., an epoxy resin can be used.

As shown in FIGS. 15A and 15B, the plurality of ball electrodes 10 and plurality of lands 24 are arranged substantially in an array on the lower surface of the package mold 2. The semiconductor apparatus according to the fifth preferred embodiment of the present invention is a peripheral type semiconductor package in which the plurality of ball electrodes 10 and plurality of lands 24 are not arranged on the entire lower surface of the package mold 2, and the ball electrodes 10 are absent in some of an area 11.

The plurality of additional ball electrodes 12 are formed on the plurality of lands 24 formed at arbitrary portions on the diagonals of the area 11 where no ball electrodes 10 are present. The plurality of additional lands 25 are arranged substantially in an array even at a portion where no ball electrodes 10 are present. The lands 24 and 25 can be formed by patterning a metal such as copper on the semiconductor package 1.

The materials of the plurality of ball electrodes 10 and plurality of additional ball electrodes 12 are not particularly limited, and e.g., lead-free solder can be used.

A method of manufacturing a semiconductor apparatus according to this embodiment will be described. According to this semiconductor apparatus manufacturing method, the semiconductor package 1 shown in FIGS. 15A and 15B is arranged on one surface of a printed circuit board, and another semiconductor package is arranged on the other surface of the printed circuit board.

First, groups of the lands 24 and 25 are formed on the semiconductor package 1. The plurality of ball electrodes 10 and plurality of additional ball electrodes 12 are formed on, of the groups of lands 24 and 25, the group of lands 24 which are located in a predetermined arrangement area.

A plurality of ball electrodes are arranged in a predetermined arrangement area of the second semiconductor package.

The positions of the first and second semiconductor packages on the printed circuit board are determined.

After the positions on the printed circuit board are determined, at least one additional ball electrode (not shown) is further formed on, of the groups of lands 24 and 25 of the first semiconductor package 1, the group of lands 25 on which the plurality of ball electrodes 10 and plurality of additional ball electrodes 12 are not formed.

The semiconductor package 1 is arranged on one surface of the printed circuit board, and another semiconductor package is arranged on the other surface of the printed circuit board. At this time, the additional ball electrodes are arranged to oppose an outermost ball electrode which is located at a corner of the predetermined arrangement area of the second semiconductor package through the printed circuit board.

In this manner, according to this embodiment, the additional lands 25 are formed in advance at a portion where no ball electrodes are present. Then, after the positions of the semiconductor packages on the printed circuit board are determined, an additional ball electrode can be separately arranged at a position to oppose the outermost ball electrode of the semiconductor package.

The first to fifth embodiments are exemplified by a case wherein at least one of the plurality of ball electrodes of a semiconductor package on one side is arranged at a position to oppose the outermost ball electrode located at a corner of that area of a semiconductor package on the opposite side where the plurality of ball electrodes are arranged. However, the present invention is not limited to this. Alternatively, at least one of the ball electrodes of a semiconductor package on one side may be arranged at a position to oppose a corner (i.e., at the vertex and its vicinity of that area of a semiconductor package on the opposite side where the plurality of ball electrodes are arranged) of that area of the semiconductor package on the opposite side where the plurality of ball electrodes are arranged.

As many apparently widely different embodiments of the present invention can be made without departing from the spirit and scope thereof, it is to be understood that the invention is not limited to the specific embodiments thereof except as defined in the appended claims.

CLAIM OF PRIORITY

This application claims priority from Japanese Patent Application No. 2004-360498 filed on Dec. 13, 2004 and No. 2005-347938 filed on Dec. 1, 2005, which is hereby incorporated by reference herein.

What is claimed is:

1. A semiconductor apparatus comprising:

a printed circuit board;

a peripheral type first semiconductor package which has a first group of ball electrodes arranged in a peripheral type first arrangement area, a first group of additional ball electrodes arranged in part of an area inside said first arrangement area, and a first semiconductor device electrically connected to the first group of ball electrodes and which is arranged on a first surface of said printed circuit board; and a peripheral type second semiconductor package which has a second group of ball electrodes arranged in a peripheral type second arrangement area, a second group of additional ball electrodes arranged in part of an area inside said second arrangement area, and a second semiconductor device electrically connected to the second group of ball electrodes and which is arranged on a second surface of said printed circuit board, wherein a ball electrode located at at least one corner of said first group of ball electrodes is arranged at a position to oppose said second group of additional ball electrodes through said printed circuit board so as to mitigate stress generated at least on the one corner of said first group of ball electrodes, and a ball electrode located at at least one corner of said second group of ball electrodes is arranged at a position to oppose said first group of additional ball electrodes through said printed circuit board so as to mitigate stress generated at least on the one corner of said first group of ball electrodes.

2. The apparatus according to claim 1, wherein said first and second semiconductor packages are arranged to be displaced from each other in substantially diagonal directions thereof through said printed circuit board, said first group of additional ball electrodes are arranged on a diagonal of said area inside said first arrangement area, and said group of second additional ball electrodes are arranged on a diagonal of said area inside said second arrangement area.

3. The apparatus according to claim 1, wherein said first semiconductor package has a semiconductor device and a package mold which covers said semiconductor device, and a third group of ball electrodes are arranged, at a position to correspond to an edge of said semiconductor device of said first semiconductor package, to oppose said second group of ball electrodes through said printed circuit board.

4. The apparatus according to claim 3, wherein said second semiconductor package has a semiconductor device and a package mold which covers said semiconductor device, and a fourth group of ball electrodes are arranged, at a position to correspond to an edge of said semiconductor device of said second semiconductor package, to oppose said first group of ball electrodes through said printed circuit board.

5. The apparatus according to claim 1, wherein said first and second groups of additional ball electrodes comprise dummy electrodes which do not function electrically.

6. A semiconductor apparatus comprising:

a printed circuit board;

a peripheral type first semiconductor package which has a first group of ball electrodes arrayed in a peripheral type first arrangement area, a first group of additional ball electrodes arranged in part of an area inside said first arrangement area, and a first semiconductor device electrically connected to the first group of ball electrodes and which is arranged on a first surface of said printed circuit board; and a second semiconductor package which has a second group of ball electrodes arranged in a second arrangement area, and a second semiconductor device electrically connected to the second group of ball electrodes and which is arranged on a second surface of said printed circuit board, wherein ball electrodes located at all corners of said second group of ball electrodes are arranged at a position to oppose said first group of additional ball electrodes through said printed circuit board so as to mitigate stress generated at least on the one corner of said first group of ball electrodes.

7. The apparatus according to claim 6, wherein said second semiconductor package is smaller than said first semiconductor device.

8. The apparatus according to claim 7, wherein said first semiconductor package has a semiconductor device and a package mold which covers said semiconductor device, and a third group of ball electrodes are arranged, at a position to correspond to an edge of said semiconductor device of said first semiconductor package, to oppose said second group of ball electrodes through said printed circuit board.

9. An apparatus comprising:
a substrate having a pair of opposing sides;
at least two peripheral type semiconductor packages mounted to the opposing sides of the substrate; and
a plurality of electrodes, each of the electrodes being attached to at least one of the peripheral type semiconductor packages,
wherein, each of the peripheral type semiconductor packages, has a first group of electrodes arranged in peripheral area and a second group of electrodes arranged within the peripheral area, each of the group of electrodes being arranged to define at least one corner, and
wherein, on each of the opposing sides of the substrate, a first opposing electrode is located at the corner of one of the first group of electrodes and is positioned to correspond to a second opposing electrode of one of the second group of electrodes on the opposing side of the substrate so as to mitigate stress generated at least on the one corner of said first group of ball electrodes.

10. The apparatus according to claim 9, wherein the plurality of electrodes comprises a plurality of ball electrodes.

11. The apparatus according to claim 9, wherein the at least two peripheral type semiconductor packages are arranged to be displaced from each other in substantially diagonal directions.

12. The apparatus according to claim 11, wherein on each of the opposing sides of the substrate, the second group of electrodes are arranged on a diagonal of the second area.

13. The apparatus according to claim 9, wherein the plurality of electrodes comprises a plurality of ball electrodes.

14. The apparatus according to claim 9, wherein the first and second opposing electrodes are electrically connected to one another through the substrate.

15. The apparatus according to claim 9, wherein, on each of the opposing sides of the substrate, the second group of electrodes are arranged on a diagonal of the second area.

16. A semiconductor apparatus comprising:
a printed circuit board;
a peripheral type first semiconductor package which has a first group of ball electrodes arranged in a peripheral type first arrangement area, a first group of additional ball electrodes arranged in part of an area inside said first arrangement area and which is arranged on a first surface of said printed circuit board, and a first semiconductor device arranged inside the first group of ball electrodes and which is arranged at a position to oppose the first group of additional ball electrodes; and
a peripheral type second semiconductor package which has a second group of ball electrodes arranged in a peripheral type second arrangement area, a second group of additional ball electrodes arranged in part of an area inside said second arrangement area and which is arranged on a second surface of said printed circuit board, and a second semiconductor device arranged inside the second group of ball electrodes and which is arranged at a position to oppose the second group of additional ball electrodes,
wherein a ball electrode located at at least one corner of said first group of ball electrodes is arranged at a position to oppose said second group of additional ball electrodes through said printed circuit board so as to mitigate stress generated at least on the one corner of said first group of ball electrodes, and
a ball electrode located at at least one corner of said second group of ball electrodes is arranged at a position to oppose said first group of additional ball electrodes through said printed circuit board so as to mitigate stress generated at least on the one corner of said first group of ball electrodes.

* * * * *

UNITED STATES PATENT AND TRADEMARK OFFICE
CERTIFICATE OF CORRECTION

PATENT NO.         : 7,247,945 B2                                    Page 1 of 1
APPLICATION NO.    : 11/300230
DATED              : July 24, 2007
INVENTOR(S)        : Yasuhiro Sawada It is certified that error appears in the above-identified patent and that said Letters Patent is hereby corrected as shown below:

In the Specification:

Col. 6, line 7, please replace "lob" with --10*b*--.

Col. 8, line 25, please replace "lob" with --10*b*--.

Signed and Sealed this

Eighteenth Day of September, 2007

JON W. DUDAS
*Director of the United States Patent and Trademark Office*